(12) United States Patent
Song et al.

(10) Patent No.: US 11,641,103 B2
(45) Date of Patent: May 2, 2023

(54) POWER SEMICONDUCTOR SWITCH CLAMPING CIRCUIT

(71) Applicant: ABB Schweiz AG, Baden (CH)

(72) Inventors: Xiaoqing Song, Apex, NC (US); Pietro Cairoli, Cary, NC (US)

(73) Assignee: ABB SCHWEIZ AG, Baden (CH)

( * ) Notice: Subject to any disclaimer, the term of this patent is extended or adjusted under 35 U.S.C. 154(b) by 76 days.

(21) Appl. No.: 17/091,630

(22) Filed: Nov. 6, 2020

(65) Prior Publication Data

US 2022/0149615 A1 May 12, 2022

(51) Int. Cl.
| | | |
|---|---|---|
| *H02H 9/04* | (2006.01) | |
| *G05F 3/18* | (2006.01) | |
| *H01C 7/12* | (2006.01) | |
| *H03K 17/08* | (2006.01) | |
| *H03K 17/10* | (2006.01) | |
| *H03K 17/72* | (2006.01) | |

(52) U.S. Cl.
CPC ............. *H02H 9/042* (2013.01); *G05F 3/18* (2013.01); *H01C 7/12* (2013.01); *H03K 17/08* (2013.01); *H03K 17/105* (2013.01); *H03K 17/72* (2013.01)

(58) Field of Classification Search
CPC . H02H 9/042; G05F 3/18; H01C 7/12; H03K 17/08; H03K 17/105; H03K 17/72
USPC ........................................................ 361/118
See application file for complete search history.

(56) References Cited

U.S. PATENT DOCUMENTS

| | | |
|---|---|---|
| 4,631,621 A | 12/1986 | Howell |
| 8,422,182 B2 | 4/2013 | Boudet et al. |
| 9,246,324 B2 | 1/2016 | Skarby |
| 10,276,321 B2 | 4/2019 | Kennedy et al. |
| 11,431,164 B2* | 8/2022 | Schork ................ H02H 3/205 |
| 2002/0159212 A1 | 10/2002 | Oughton, Jr. |
| 2010/0277006 A1 | 11/2010 | Urciuoli |
| 2012/0200967 A1 | 8/2012 | Mikolajczak |
| 2013/0021708 A1 | 1/2013 | Demetriades et al. |
| 2016/0322809 A1 | 11/2016 | Wang et al. |
| 2018/0240575 A1 | 8/2018 | To et al. |
| 2018/0331534 A1* | 11/2018 | Nojima ................ H02H 9/041 |

(Continued)

FOREIGN PATENT DOCUMENTS

| | | |
|---|---|---|
| DE | 4313882 C1 | 8/1994 |
| EP | 0272898 A2 | 6/1988 |
| EP | 0118007 B1 | 5/1990 |

(Continued)

OTHER PUBLICATIONS

R.R. Bordreaux et al, "A comparison of MOSFETs, IGBTs, and MCTs for Solid State Circuit Breakers" APEC '96 (7 pp).

(Continued)

*Primary Examiner* — Yemane Mehari

(74) *Attorney, Agent, or Firm* — Greenberg Traurig, LLP

(57) ABSTRACT

A power semiconductor circuit is provided for clamping the voltage across the circuit when a power semiconductor switch is opened (i.e., turned off). The circuit may include a first surge arrester and a first semiconductor switch coupled in parallel with the power semiconductor switch. The first semiconductor switch is coupled in series with the first surge arrester. A second surge arrester may be coupled to the gate of the first semiconductor switch to control current flow through the first semiconductor switch and the first surge arrester.

20 Claims, 5 Drawing Sheets

(56) References Cited

U.S. PATENT DOCUMENTS

2019/0103742 A1    4/2019  Kennedy et al.

FOREIGN PATENT DOCUMENTS

| EP | 0197658 B1 | | 5/1993 | |
|----|---|---|---|---|
| GB | 2294166 A | | 4/1996 | |
| GB | 2493911 A | * | 2/2013 | ........... H01H 33/596 |
| WO | 2011/098145 A1 | | 8/2011 | |
| WO | 2017/024577 A1 | | 2/2017 | |
| WO | WO-2019192674 A1 | * | 10/2019 | ......... H01L 25/0756 |
| WO | 2020/106964 A1 | | 5/2020 | |

OTHER PUBLICATIONS

K. Handt et al, "Intelligent, compact and robust semiconductor circuit breaker based on silicon carbide devices" Power Electronics & Energy Management, 2008 (6 pp).

E. Haugan et al. Discrimination In Offshore and Marine DC Distribution Systems (COMPEL), 2016 (7 pp).

* cited by examiner

POWER SEMICONDUCTOR SWITCH CLAMPING CIRCUIT

BACKGROUND

The present inventions relate generally to power semiconductor switching devices, and more particularly, to a voltage clamping circuit in parallel with the switching device to dissipate energy when opening the device.

In the art of power semiconductor switching devices, it is common to dissipate system inductive energy and protect the power semiconductor device at the opening of device with a metal oxide varistor (MOV) connected in parallel with the semiconductor device. Although this is a simple solution, it requires a substantial overdesign of the semiconductor device with respect to the voltage blocking capability of the device. For example, most MOV designs require the power semiconductor device to be sized for a blocking voltage of 2-2.5× the nominal system voltage (e.g., a 2,500 V power semiconductor device may be needed for a 1,000 V system). Consequently, the cost of the power semiconductor device that must be used is higher.

Accordingly, an improved design for power semiconductor switching devices would be desirable.

SUMMARY

A power semiconductor circuit is described for improving the blocking voltage and/or decreasing the cost of the circuit. The circuit may have a first surge arrester and a first semiconductor switch in series with each other and in parallel with a power semiconductor switch. A second surge arrester may be coupled to the gate of the first semiconductor switch to passively control opening and closing of the switch in order to control current flow through the first surge arrester and the first semiconductor switch. The invention may also include any other aspect described below in the written description or in the attached drawings and any combinations thereof.

BRIEF DESCRIPTION OF SEVERAL VIEWS OF THE DRAWINGS

The invention may be more fully understood by reading the following description in conjunction with the drawings, in which.

DETAILED DESCRIPTION

The embodiments herein provide a hybrid voltage clamping circuit which may permit the use of a power semiconductor switching device (also referred to as a solid state circuit breaker) with a blocking voltage of 1.2-1.5× the nominal system voltage. As a result, the cost of the power semiconductor device may be reduced compared to conventional designs by using a lower rated device (e.g., a 40% cost reduction or more may be possible). The hybrid voltage clamping circuit is preferably passively activated and combines the action of one or more MOVs and one or more thyristors. That is, the passive activation circuit may be used without any external control signal for the thyristor. Instead, the thyristor may be automatically turned on during the MOV voltage clamping phase (i.e., fault current interruption) and turned off after the fault current is interrupted to withstanding at least part of the system voltage. When a turn-off/opening event occurs, the hybrid voltage clamping circuit may utilize the MOV to perform the voltage clamping and energy dissipation needed to safely open the power semiconductor switching device. After the turn-off/opening event, the passive activation circuit enables the thyristor to increase the nominal voltage withstanding capability of the voltage clamping circuit and reduce the leakage current in the off state of the voltage clamping circuit (e.g., a 10-100× leakage current reduction may be possible compared to the use of a MOV only). It is also possible for the hybrid circuit to be tuned in order to generate a specific clamping voltage/nominal voltage ratio. Preferably, the hybrid voltage clamping circuit uses a low current thyristor, which has a bidirectional voltage blocking capability and can handle a high surge current in order to reduce the total cost of the voltage clamping circuit. The hybrid voltage clamping circuit may be compatible with solid state circuit breakers with current ratings up to 5000 A. The thyristor preferably has a current rating that is less than 40% of the current rating of the power semiconductor switch 10, which allows the cost of the circuit to be minimized.

Figure 1A:
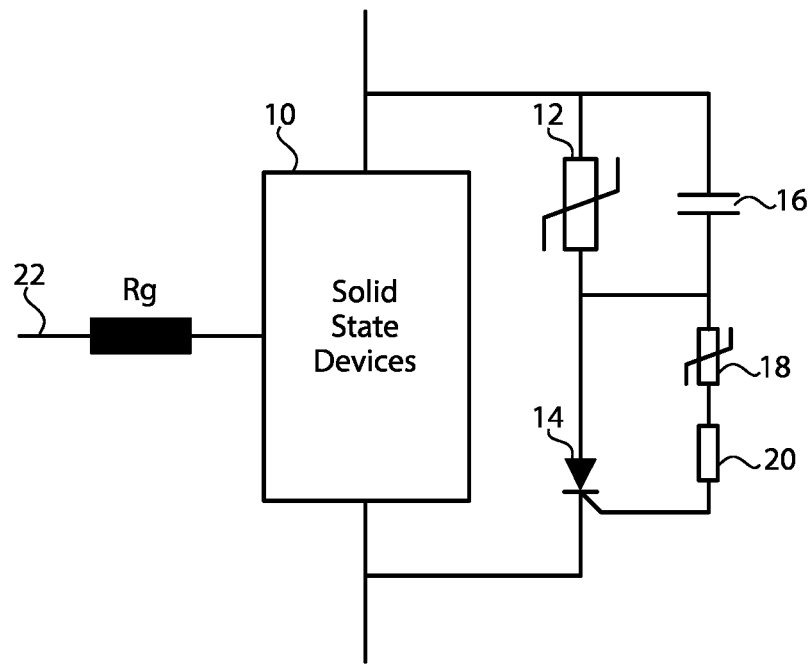
FIG. 1A is a schematic of one embodiment of a power semiconductor circuit.
Figure 1B:
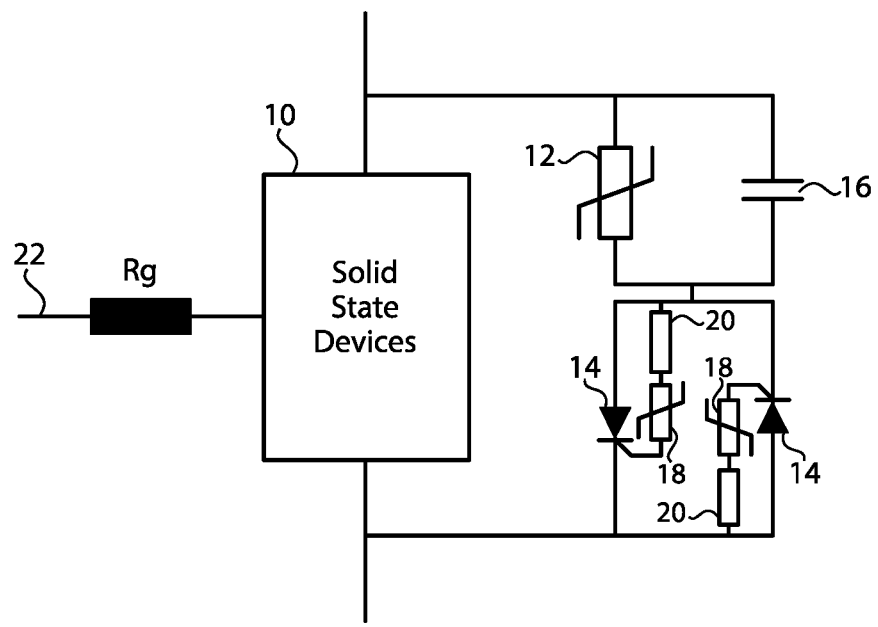
FIG. 1B is a schematic of another embodiment of a power semiconductor circuit.

As shown in FIGS. 1A and 1B, the power semiconductor circuit with hybrid voltage clamping may include one or more power semiconductor switches 10, one or more primary MOVs 12, one or more thyristors 14, one or more capacitors 16 and one or more secondary MOVs 18. As is understood, the power semiconductor switch 10 is controlled to be in a closed state (on) or an open state (off) with a control signal 22 applied to the gate of the power semiconductor switch 10. As shown, FIG. 1A utilizes a single thyristor 14, which may be more suitable for DC applications. By contrast, FIG. 1B utilizes two thyristors 14 coupled parallel to each other, which may be more suitable for AC applications. As shown in FIGS. 1A-B, the primary MOV 12 may be coupled parallel with the power semiconductor switch 10. The thyristor 14 may be coupled in series with the primary MOV 12 and parallel with the power semiconductor switch 10. The capacitor 16 may be coupled parallel with the primary MOV 12 and in series with the thyristor(s) 14. As shown in FIG. 1A, the secondary MOV 18 may be coupled in series with the primary MOV 12. The secondary MOV 18 may also be coupled to the gate of the thyristor 14. The capacitor 16 is thus also coupled in series with the thyristor 14. In FIG. 1B, an additional secondary MOV 18 may be coupled to the gate of the additional thyristor 14 and coupled to the output of the first thyristor 14 opposite from the primary MOV 12. It may also be desirable to couple a resistor 20 in series with the secondary MOVs 18 between the gate of the first thyristor 14 and the primary MOV 12 and between the gate of the second thyristor 14 and the output of the first thyristor 14.

Figure 6:
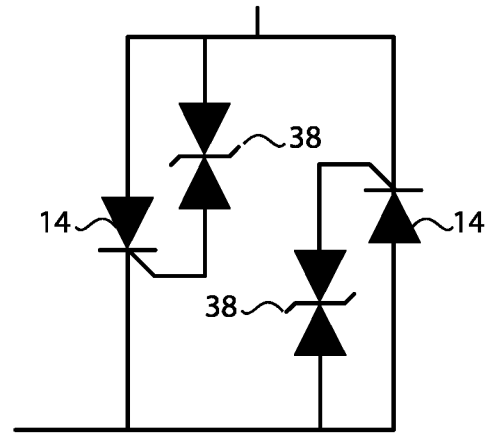
FIG. 6 is a schematic of another embodiment of a passive activation circuit for the power semiconductor circuit.

It is understood that the circuits herein may be varied as desired. For example, the power semiconductor circuit (i.e., switch 10 and related voltage clamping circuit (MOV 12, switch 14, etc.)) is preferably a solid state circuit breaker. Although various types of power semiconductor switches 10 may be used, examples include insulated-gate bipolar transistors (IGBTs), bipolar junction transistors (BGTs), metal-oxide semiconductor field effect transistors (MOSFETs), gate turn-off thyristors (GTOs), MOS-controlled thyristors (MCTs), integrated gate-commutated thyristors (IGCTs), silicon carbide (SiC) switches, gallium nitride (GaN) switches, or any other type of semiconductor switch that controls current flow to power electrical equipment. The primary MOV 12 may be a surge arrestor, including a varistor. The secondary MOV 18 may also be a surge arrestor, including a varistor (FIGS. 1A-B, 5 & 7) or a TVS diode (FIGS. 6 & 8). The thyristor 14 may be a semiconductor switch but is preferably a bidirectional voltage blocking switch with surge current capability that allows current flow through the thyristor 14 from the primary MOV 12.

Figure 2:
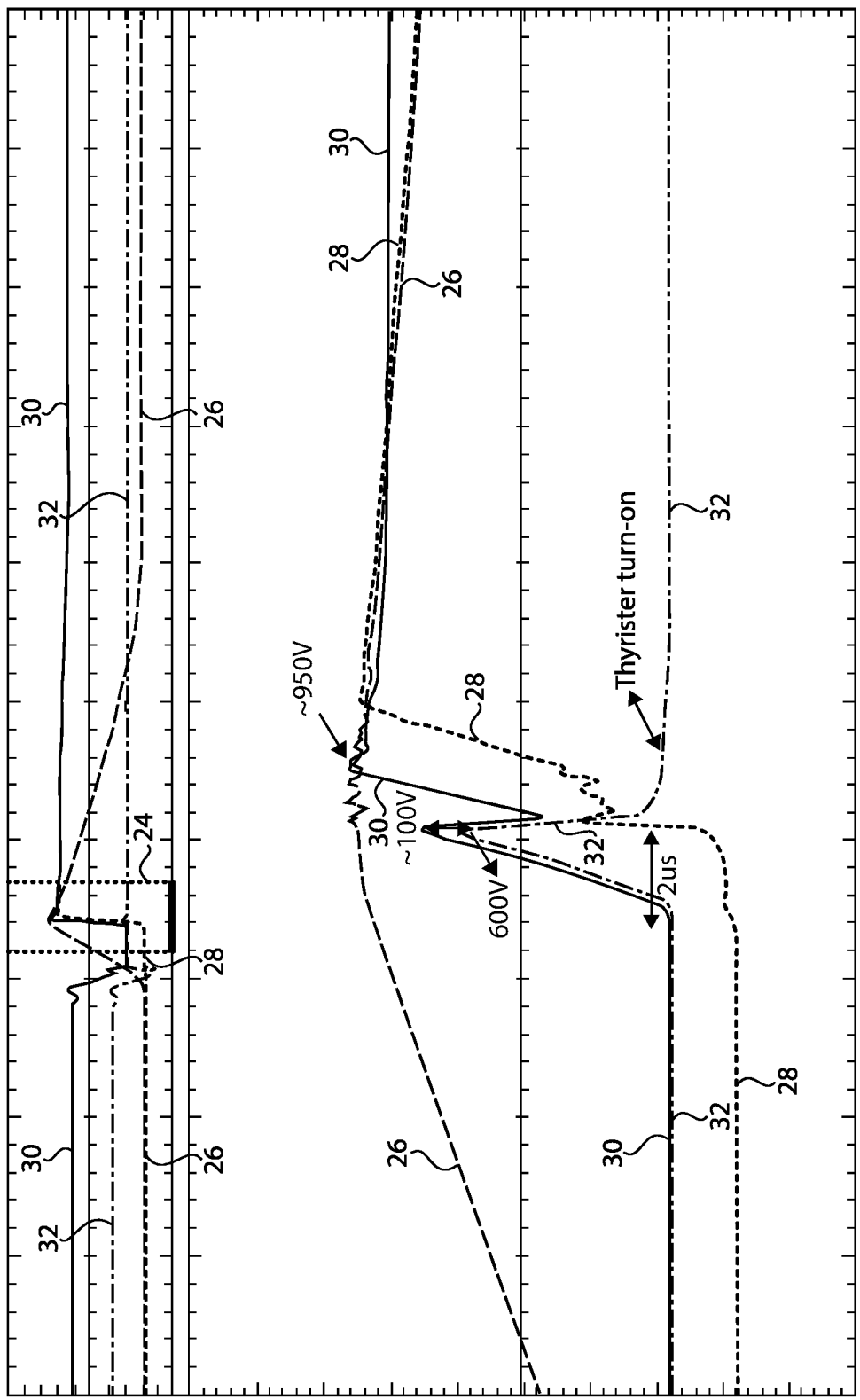
FIG. 2 is a chart showing the electrical properties of the power semiconductor circuit.
Figure 3:
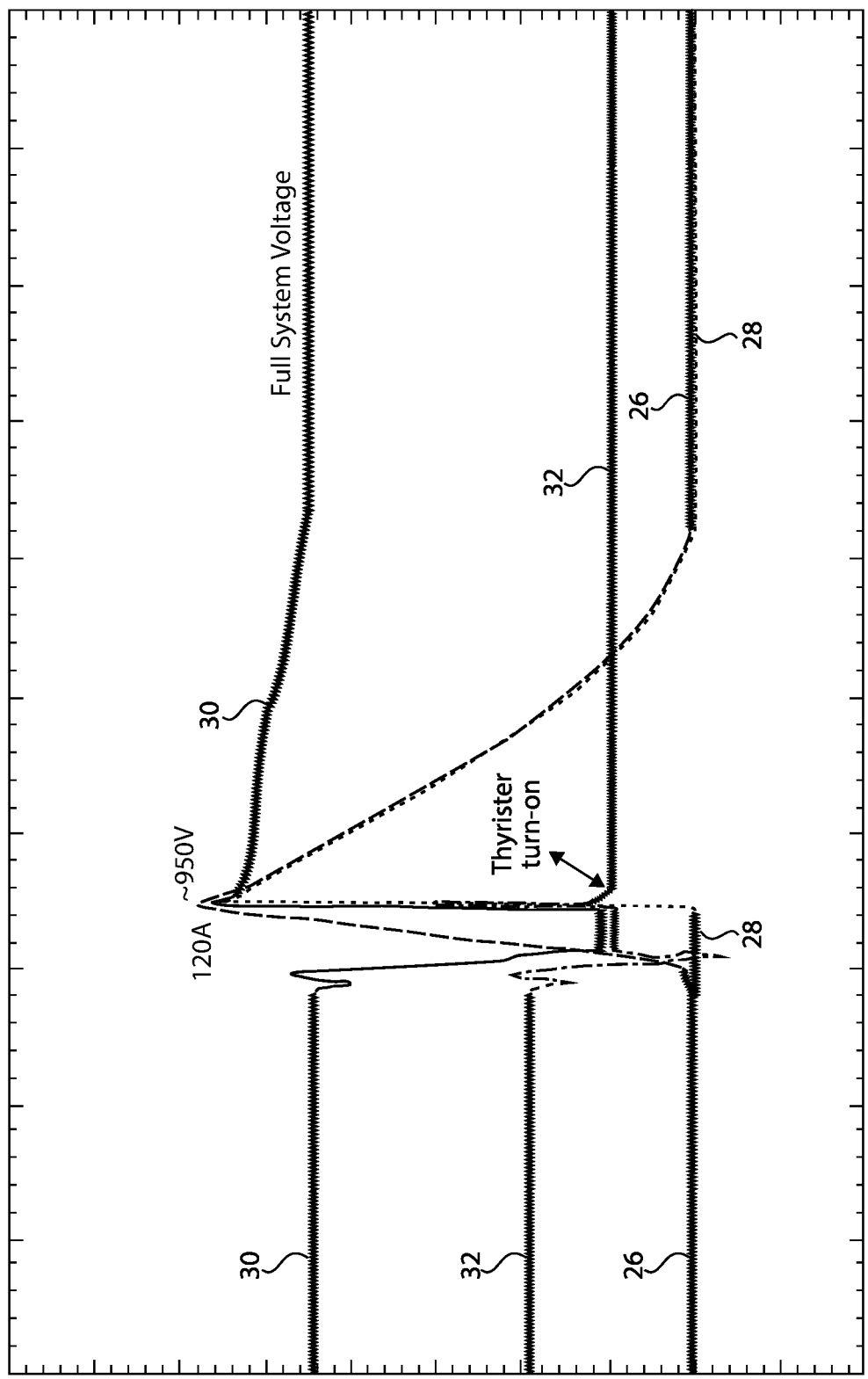
FIG. 3 is a chart showing a wider view of the electrical properties of the power semiconductor circuit.

FIGS. 2 and 3 show electrical properties of the semiconductor switch circuit. FIG. 2 illustrates a longer sequence of a test performed on the circuit along the top of the figure, with the main part of the figure showing a zoomed window 24 of the sequence in greater detail. FIG. 3 illustrates a wider window of the sequence at a lower zoom level. The electrical properties that are shown include total current 26 through the power semiconductor circuit, current 28 through the voltage clamping circuit (i.e., the primary MOV 12, thyristor 14 and capacitor 16), voltage 30 across the primary MOV 12 and thyristor 14, and voltage 32 across the thyristor 14. It is understood that operational use of the circuit will result in different electrical properties from those shown.

In the off state (blocking state), the voltage 30 is shared by the primary high current MOV 12 and the thyristor 14. The thyristor 14 may take 30-70% of the voltage 30 applied to the circuit and increases the nominal voltage rating of the circuit compared to using a MOV 12 by itself. Once a turn-off (current interruption) occurs, the primary high current MOV 12 clamps the voltage 30 to a value lower than the maximum blocking voltage of the power semiconductor switch 10. This happens as a result of the passive activation of the thyristor 14 once the voltage 32 on the passive activation circuit goes over a predefined value (normally higher than the nominal system voltage). For example, in FIGS. 3-4, the voltage may be clamped to less than 950 V for a system voltage of 700 V (i.e., a 1.35× peak voltage/nominal voltage ratio). The thyristor 14 voltage 32 rises after the fault current is interrupted, which means the thyristor 14 withstands part of the system voltage (~200 V). The primary MOV 12 withstands the rest system voltage (~500 V). Thus, the MOV 12 leakage current could be reduced due to a lower voltage being applied to the MOV 12.

Figure 4:
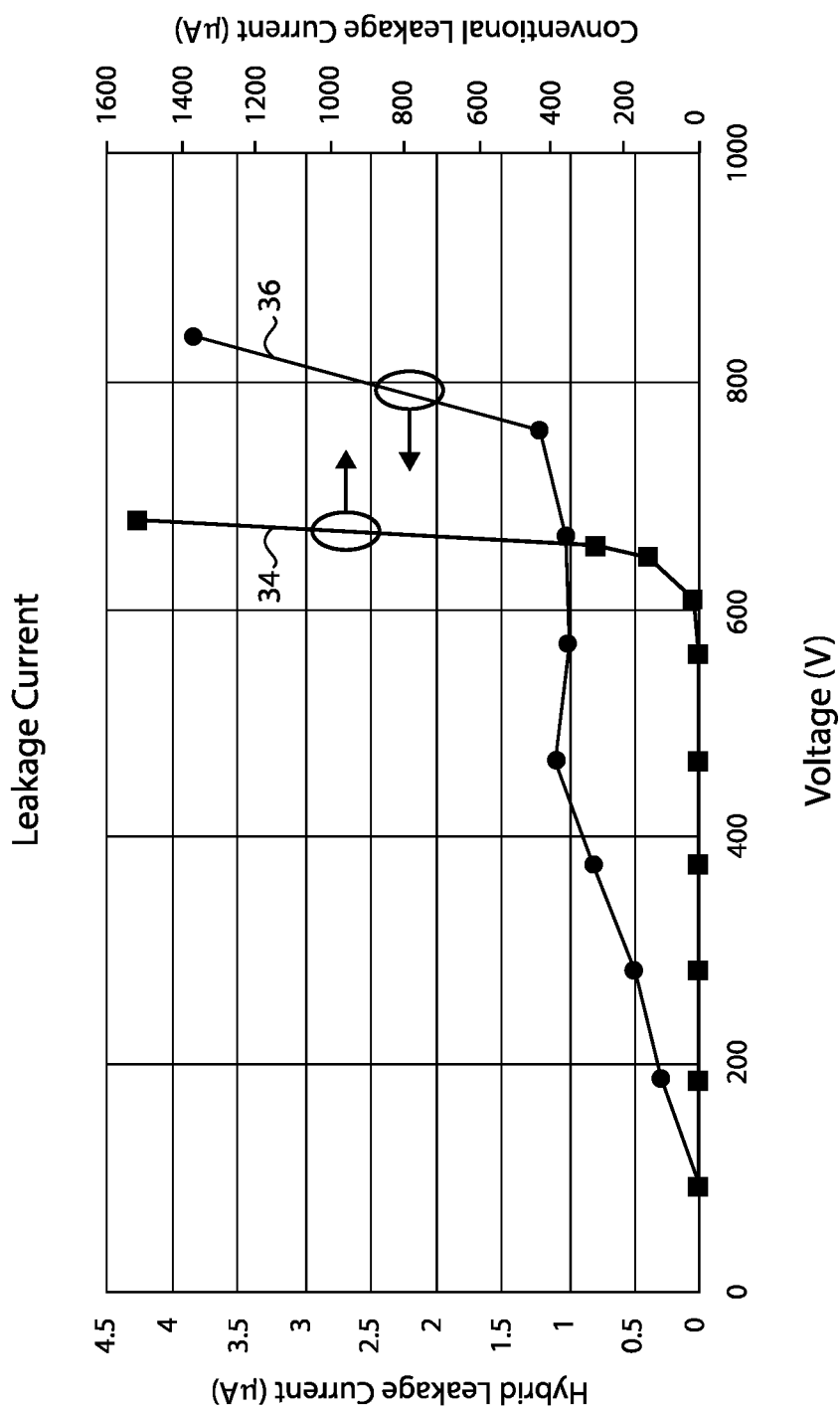
FIG. 4 is a chart showing leakage current of the power semiconductor circuit.
Figure 5:
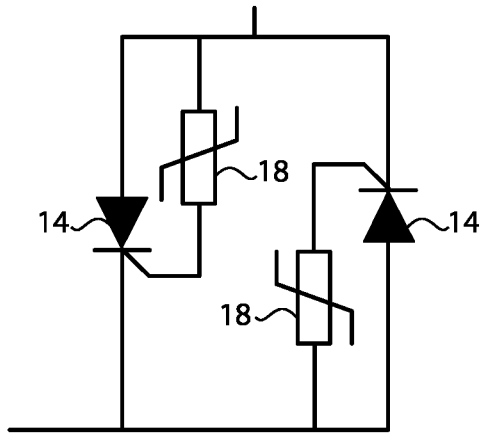
FIG. 5 is a schematic of another embodiment of a passive activation circuit for the power semiconductor circuit.

FIG. 4 shows the results of tests of the blocking voltage (i.e., voltage where a transition from low leakage current to high leakage current occurs) of a conventional MOV circuit 34 compared to the hybrid circuit 36 herein. As shown, the hybrid circuit can block a higher system voltage (850 V vs. 600 V in the example). The hybrid circuit also shows much lower leakage current at the same voltage level (1 uA vs. 400 uA). It is noted that the expected clamping voltage during current interruption is the same in both cases (around 1000 V).

In general, it can be understood that when the power semiconductor switch 10 is turned off, current stops flowing through the switch 10 and instead flows to the parallel voltage clamping circuit (i.e., through the MOV 12 and capacitor 16 to the thyristor 14 or directly to the thyristor 14 from the other side of the switch 10 in the case of a reverse AC current). However, since the thyristor 14 is initially off, a voltage potential occurs, which is applied to the gate of the thyristor 14 through the resistor 20 and secondary MOV 18 (e.g., through the primary and secondary MOVs 12, 18). This causes the thyristor 14 to turn on and allow current flow therethrough. The voltage potential on the gate of the thyristor 14 then drops, and when the current flow through the thyristor 14 drops below a threshold, the thyristor 14 turns off again to block further current flow. It is understood that in the variations of FIG. 7-8 described below, where the gates of the thyristor 14 are not directly connected to the MOV 12, capacitor 16 or opposite side of the switch 10 but instead are connected together, that a voltage may be induced in the line connecting the gates together due to the proximity of the line to the voltage generated in the voltage clamping circuit (e.g., from the primary MOV 12 to the secondary MOV 18).

Figure 7:
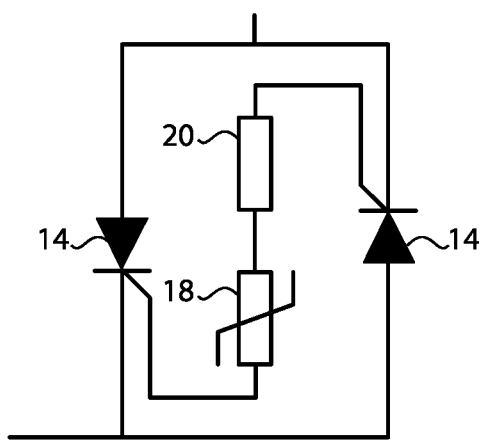
FIG. 7 is a schematic of another embodiment of a passive activation circuit for the power semiconductor circuit.
Figure 8:
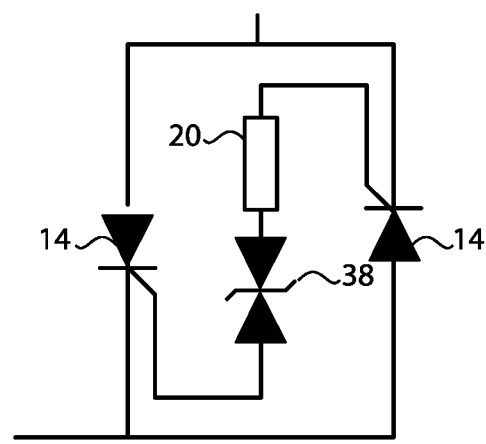
FIG. 8 is a schematic of another embodiment of a passive activation circuit for the power semiconductor circuit.

FIGS. 5-8 show additional possible variations of the power semiconductor circuit. For example, in FIG. 5, it is illustrated that the resistor 20 may be removed and only the secondary MOV 18 utilized. In FIG. 6, TVS diodes 38 may be used in place of the secondary MOVs 18. In FIG. 7, the secondary MOV 18 and resistor 20 may be shared by the thyristors 14 such that that secondary MOV 18 is coupled to the gates of both thyristors 14. In this arrangement, the secondary MOV 18 is coupled to the primary MOV 12 through the gate of the second secondary MOV 18. In FIG. 8, a shared arrangement is shown like FIG. 7 but with TVS diodes 38 instead. It is noted that like FIGS. 5-6 the resistors 20 could be removed from FIGS. 7-8 if desired.

As described, the voltage clamping circuit herein may combine the use of a main high current MOV 12 with a low current thyristor 14 in a passive activation circuit. The passive activation circuit may use inexpensive low current MOVs 18 or TVS diodes 38. The voltage clamping circuit may be capable of blocking a much higher nominal voltage compared with a solid state circuit breaker with only a MOV. The hybrid voltage clamping circuit may also greatly decrease the rated blocking voltage needed for the power semiconductor switch 10 and greatly reduce the cost of the power semiconductor switch for the same voltage rating of the circuit. The hybrid voltage clamping may also reduce the maximum system overvoltage generated by the opening of the power semiconductor switch 10, which may be important for some users who are sensitive to system overvoltages, such as datacenter applications.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A power semiconductor circuit, comprising:
   a power semiconductor switch;

a first surge arrester coupled in parallel with the power semiconductor switch;

a first semiconductor switch coupled in series with the first surge arrester and parallel with the power semiconductor switch; and a second surge arrester coupled to a gate of the first semiconductor switch and coupled to the first surge arrester;

wherein a voltage is applied to the gate of the first semiconductor switch through the first surge arrester and the second surge arrester to turn on the first semiconductor switch when the power semiconductor switch is turned off.

2. The power semiconductor circuit according to claim 1, wherein the second surge arrester is coupled in series with the first surge arrester.

3. The power semiconductor circuit according to claim 1, further comprising a capacitor coupled in parallel with the first surge arrester and in series with the first semiconductor switch.

4. The power semiconductor circuit according to claim 3, wherein the capacitor is coupled in series with the second surge arrester.

5. The power semiconductor circuit according to claim 4, wherein the second surge arrester is coupled in series with the first surge arrester.

6. The power semiconductor circuit according to claim 1, further comprising a second semiconductor switch coupled in parallel with the first semiconductor switch, a third surge arrester being coupled to a gate of the second semiconductor switch and coupled to an output of the first semiconductor switch opposite from the first surge arrester.

7. The power semiconductor circuit according to claim 1, further comprising a second semiconductor switch coupled in parallel with the first semiconductor switch, the second surge arrester being coupled to a gate of the second semiconductor switch.

8. The power semiconductor circuit according to claim 1, wherein the first semiconductor switch is a bidirectional voltage blocking switch with surge current capability allowing current flow from the first surge arrester through the first semiconductor switch.

9. The power semiconductor circuit according to claim 8, wherein the first semiconductor switch is a thyristor.

10. The power semiconductor circuit according to claim 1, further comprising a resistor coupled in series with the second surge arrester between the gate of the first semiconductor switch and the first surge arrester.

11. The power semiconductor circuit according to claim 1, wherein the power semiconductor switch has a blocking voltage of between 1.2 and 1.7 of a nominal system voltage.

12. The power semiconductor circuit according to claim 1, wherein a current rating of the first semiconductor switch is less than 40% of a current rating of the power semiconductor switch.

13. The power semiconductor circuit according to claim 1, wherein the first surge arrester is a varistor.

14. The power semiconductor circuit according to claim 13, wherein the first surge arrester is a metal oxide varistor.

15. The power semiconductor circuit according to claim 1, wherein the second surge arrester is a varistor.

16. The power semiconductor circuit according to claim 14, wherein the second surge arrester is a metal oxide varistor.

17. The power semiconductor circuit according to claim 1, wherein the second surge arrester is a TVS diode.

18. A solid state circuit breaker comprising the power semiconductor circuit according to claim 1.

19. The power semiconductor circuit according to claim 1, wherein the first semiconductor switch turns off when current flow therethrough drops below a threshold.

20. The power semiconductor circuit according to claim 1, wherein the voltage is induced from the first surge arrester to the second surge arrester.

* * * * *